US010553706B2

(12) United States Patent
Chang et al.

(10) Patent No.: US 10,553,706 B2
(45) Date of Patent: *Feb. 4, 2020

(54) METHOD FOR MANUFACTURING SEMICONDUCTOR FIN STRUCTURE WITH EXTENDING GATE STRUCTURE

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 69 days.

This patent is subject to a terminal disclaimer.

(21) Appl. No.: 15/804,787

(22) Filed: Nov. 6, 2017

(65) Prior Publication Data

US 2018/0069101 A1 Mar. 8, 2018

Related U.S. Application Data

(60) Continuation of application No. 15/298,462, filed on Oct. 20, 2016, now Pat. No. 9,837,510, which is a (Continued)

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/76224* (2013.01); *H01L 29/0649* (2013.01);
(Continued)

(58) Field of Classification Search
None
See application file for complete search history.

(56) References Cited

U.S. PATENT DOCUMENTS 7,456,476 B2 * 11/2008 Hareland .......... H01L 29/42384
257/349
8,120,073 B2 * 2/2012 Rakshit ................. H01L 29/785
257/288
(Continued)

FOREIGN PATENT DOCUMENTS

CN 1577850 A 2/2005
DE 112005000704 T5 9/2007
(Continued)

OTHER PUBLICATIONS

Notice of Allowance issued in U.S. Appl. No. 14/749,602, dated Nov. 16, 2017.
(Continued)

Primary Examiner — Vincent Wall
(74) Attorney, Agent, or Firm — McDermott Will & Emery LLP

(57) ABSTRACT

A semiconductor structure and a method for forming the same are provided. The semiconductor structure includes a substrate and a fin structure formed over the substrate. The semiconductor structure further includes an isolation structure formed around the fin structure and a gate structure formed across the fin structure. In addition, the gate structure includes a first portion formed over the fin structure and a second portion formed over the isolation structure, and the second portion of the gate structure includes an extending portion extending into the isolation structure.

20 Claims, 14 Drawing Sheets

Related U.S. Application Data division of application No. 14/621,805, filed on Feb. 13, 2015, now Pat. No. 9,502,567.

(51) Int. Cl.
*H01L 29/06* (2006.01)
*H01L 29/40* (2006.01)
*H01L 29/423* (2006.01)
*H01L 21/762* (2006.01)

(52) U.S. Cl.
CPC ........ *H01L 29/401* (2013.01); *H01L 29/4238* (2013.01); *H01L 29/42372* (2013.01); *H01L 29/42376* (2013.01); *H01L 29/6653* (2013.01); *H01L 29/6656* (2013.01); *H01L 29/66545* (2013.01); *H01L 29/66553* (2013.01); *H01L 29/785* (2013.01)

(56) References Cited

U.S. PATENT DOCUMENTS

| | | | |
|---|---|---|---|
| 8,441,072 B2 | 5/2013 | Tsai et al. | |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 8,900,951 B1 | 12/2014 | Cheng et al. | |
| 9,704,993 B2 * | 7/2017 | Basker | H01L 29/6681 |
| 9,837,510 B2 * | 12/2017 | Chang | H01L 29/785 |
| 9,929,242 B2 * | 3/2018 | Chang | H01L 21/845 |
| 9,954,081 B2 * | 4/2018 | Chang | H01L 29/66795 |
| 2005/0224800 A1 | 10/2005 | Lindert et al. | |
| 2006/0071275 A1 | 4/2006 | Brask et al. | |
| 2006/0172497 A1 | 8/2006 | Hareland et al. | |
| 2006/0286755 A1 * | 12/2006 | Brask | H01L 29/42376 |
| | | | 438/299 |
| 2007/0054448 A1 | 3/2007 | Choi et al. | |
| 2009/0061572 A1 | 3/2009 | Hareland et al. | |
| 2010/0163970 A1 | 7/2010 | Rakshit et al. | |
| 2011/0140171 A1 | 6/2011 | Pillarisetty et al. | |
| 2011/0147711 A1 | 6/2011 | Pillarisetty et al. | |
| 2011/0147842 A1 | 6/2011 | Cappellani et al. | |
| 2012/0313170 A1 | 12/2012 | Chang et al. | |
| 2012/0313710 A1 | 12/2012 | Hull, Jr. et al. | |
| 2013/0082304 A1 | 4/2013 | Liu et al. | |
| 2013/0224945 A1 | 8/2013 | Liu et al. | |
| 2013/0285141 A1 | 10/2013 | Kuo et al. | |
| 2013/0309839 A1 | 11/2013 | Wilson et al. | |
| 2014/0061792 A1 | 3/2014 | Bu et al. | |
| 2014/0070328 A1 | 3/2014 | Goto et al. | |
| 2014/0145242 A1 | 5/2014 | Huang et al. | |
| 2014/0203370 A1 | 7/2014 | Maeda et al. | |
| 2014/0206156 A1 | 7/2014 | Liu et al. | |
| 2014/0264575 A1 | 9/2014 | Tsai et al. | |
| 2014/0282326 A1 | 9/2014 | Chen et al. | |
| 2014/0319623 A1 | 10/2014 | Tsai et al. | |
| 2015/0021697 A1 | 1/2015 | Colinge et al. | |
| 2015/0069473 A1 | 3/2015 | Glass et al. | |
| 2015/0228763 A1 | 8/2015 | Lin et al. | |
| 2016/0133632 A1 | 5/2016 | Park et al. | |
| 2016/0204215 A1 * | 7/2016 | Chang | H01L 21/845 |
| | | | 257/401 |
| 2017/0170300 A1 * | 6/2017 | Chang | H01L 29/66795 |
| 2018/0240895 A1 * | 8/2018 | Chang | H01L 29/66795 |

FOREIGN PATENT DOCUMENTS

| | | |
|---|---|---|
| DE | 102014100397 A1 | 7/2014 |
| DE | 102013108385 B3 | 1/2015 |
| KR | 10-2012-0096436 A | 8/2012 |
| KR | 10-2014-0127725 A | 11/2014 |
| TW | 201113984 A | 4/2011 |

OTHER PUBLICATIONS

Final Office Action U.S. Appl. No. 14/749,602 dated Jun. 22, 2016.
Office Action dated Feb. 3, 2016, received in corresponding German Application No. 10 2015 106 700.5.
Office Action dated Dec. 14, 2015, received in related U.S. Appl. No. 14/749,602.
Office Action Korean Patent Application No. 10-2015-0071057 dated Jun. 14, 2016 with full English translation.
Office Action Korean Patent Application No. 10-2015-0142098 dated Sep. 2, 2016 with full English translation.
Notice of Allowance U.S. Appl. No. 14/621,805 dated Jul. 18, 2016.
Final Office Action dated Jul. 27, 2017 issued in U.S. Appl. No. 14/479,602.
Office Action issued in corresponding Taiwanese Patent Application No. 104139353 dated Dec. 30, 2016.
Notice of Allowance issued in U.S. Appl. No. 15/298,462, dated Aug. 1, 2017.
Office Action issued in U.S. Appl. No. 14/714,242, dated Jul. 3, 2017.

* cited by examiner

METHOD FOR MANUFACTURING SEMICONDUCTOR FIN STRUCTURE WITH EXTENDING GATE STRUCTURE

RELATED APPLICATIONS

This application is a continuation of U.S. application Ser. No. 15/298,462 filed on Oct. 20, 2016, which is a division of U.S. application Ser. No. 14/621,805 filed on Feb. 13, 2015, now U.S. Pat. No. 9,502,567, the entire contents of each of which applications are incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
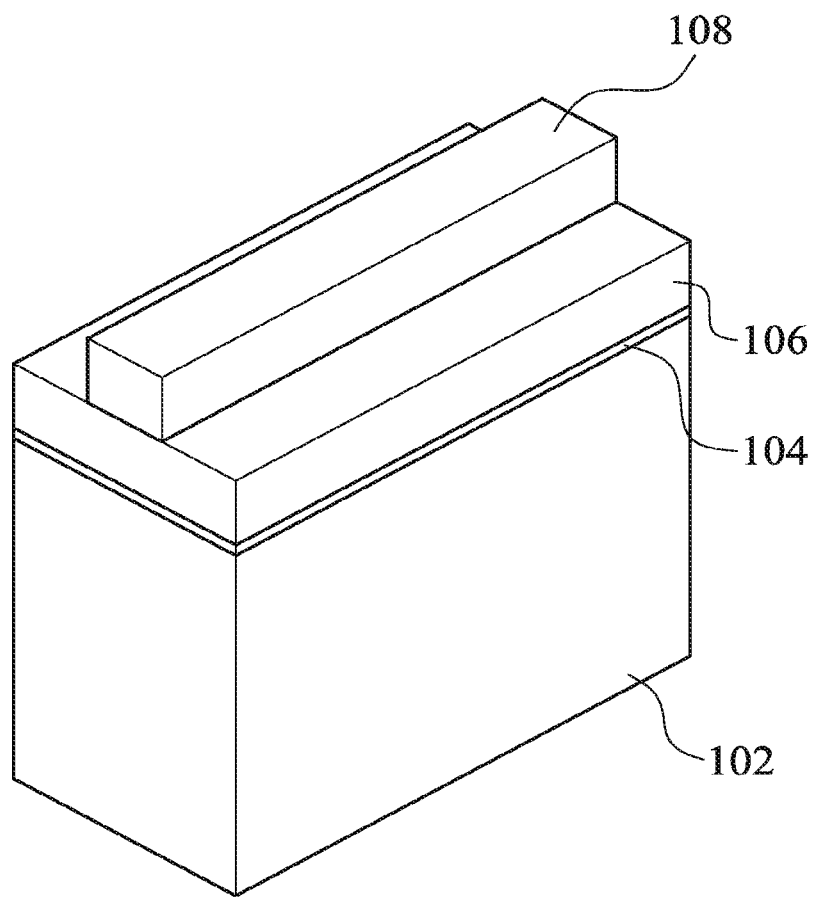
FIGS. 1A to 1J are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a gate structure formed by a "gate-last" process. That is, a dummy gate structure is formed first and is replaced by the gate structure afterwards. After the dummy gate structure is removed, a portion of an isolation structure is also removed, such that the gate structure formed afterwards can extend into the isolation structure and the performance of the structure can be improved.

FIGS. 1A to 1J are cross-sectional representations of various stages of forming a semiconductor structure 100 in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 and a mask layer 106 are formed over substrate 102, and a photo-sensitive layer 108 is formed over mask layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Figure 1B:
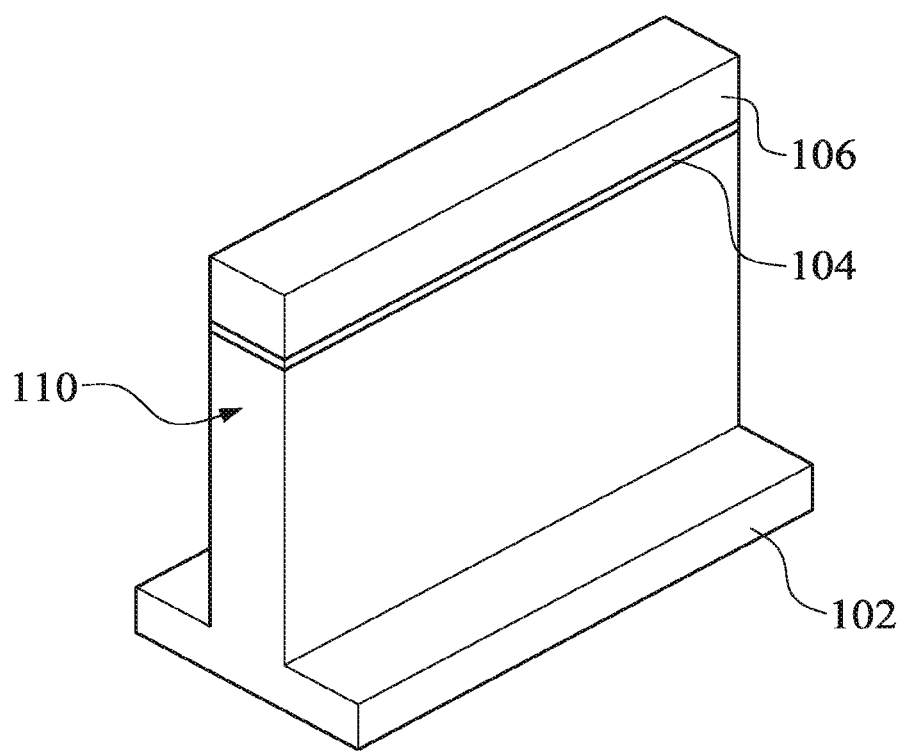

Next, a fin structure 110 is formed by sequentially etching mask layer 106, dielectric layer 104, and substrate 102 through photo-sensitive layer 108, as shown in FIG. 1B in accordance with some embodiments. Afterwards, photo-sensitive layer 108 is removed.

Figure 1C:
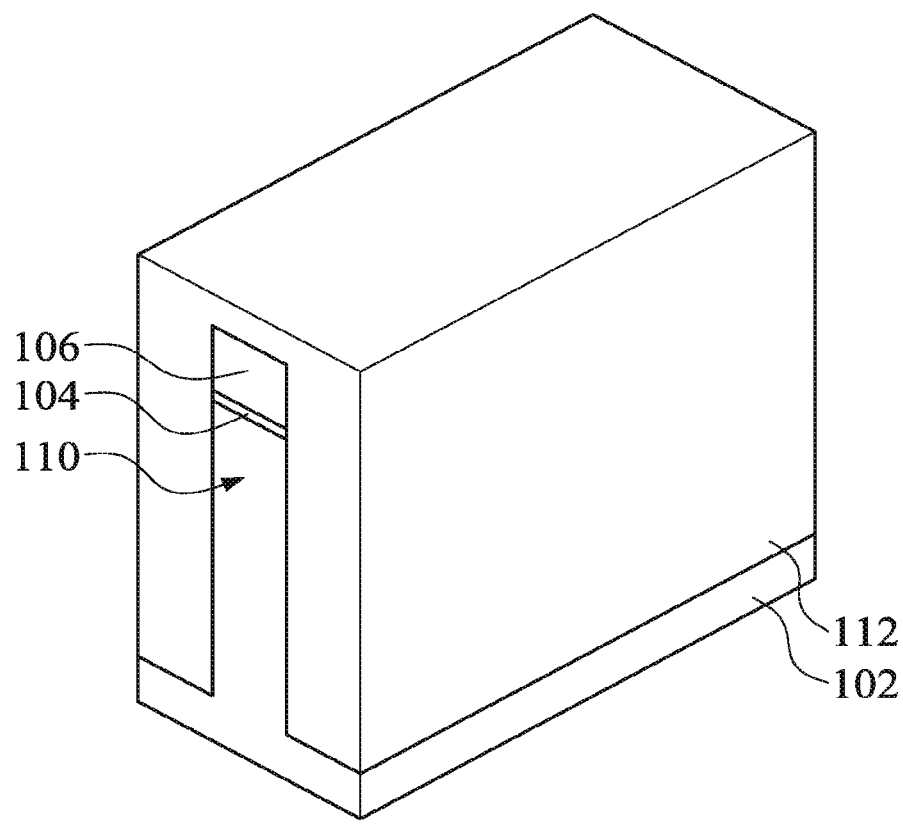

After fin structure 110 is formed, an insulating layer 112 is formed to cover fin structures 110 over substrate 102, as shown in FIG. 1C in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

Figure 1D:
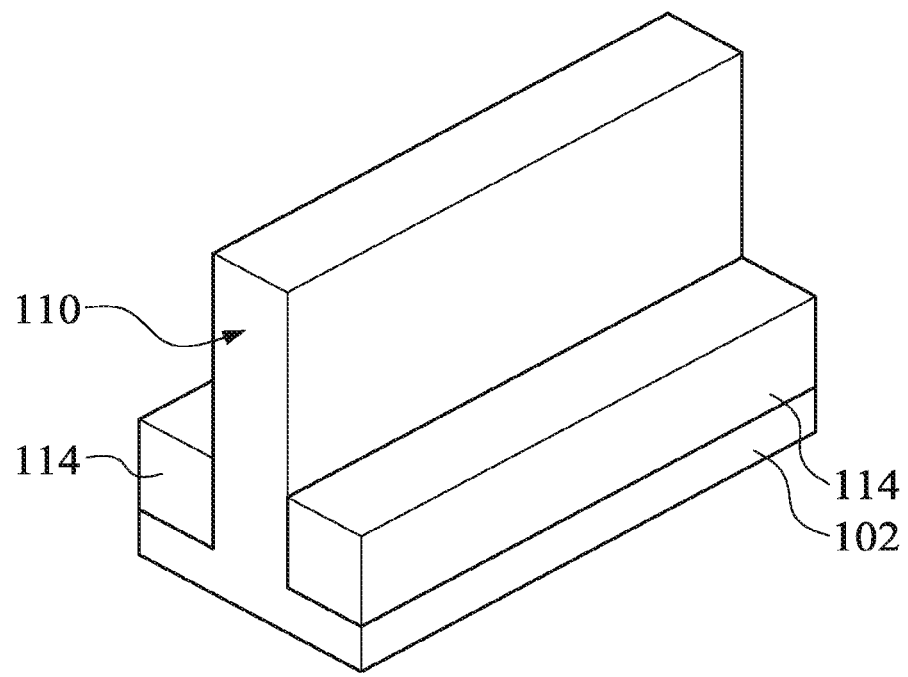

Next, insulating layer 112 is recessed to form an isolation structure 114, such as a shallow trench isolation structure, around fin structure 110, as shown in FIG. 1D in accordance with some embodiments. Insulating layer 112 may be recessed by a wet etching process or a dry etching process. In addition, mask layer 106 and dielectric layer 104 are removed.

Figure 1E:
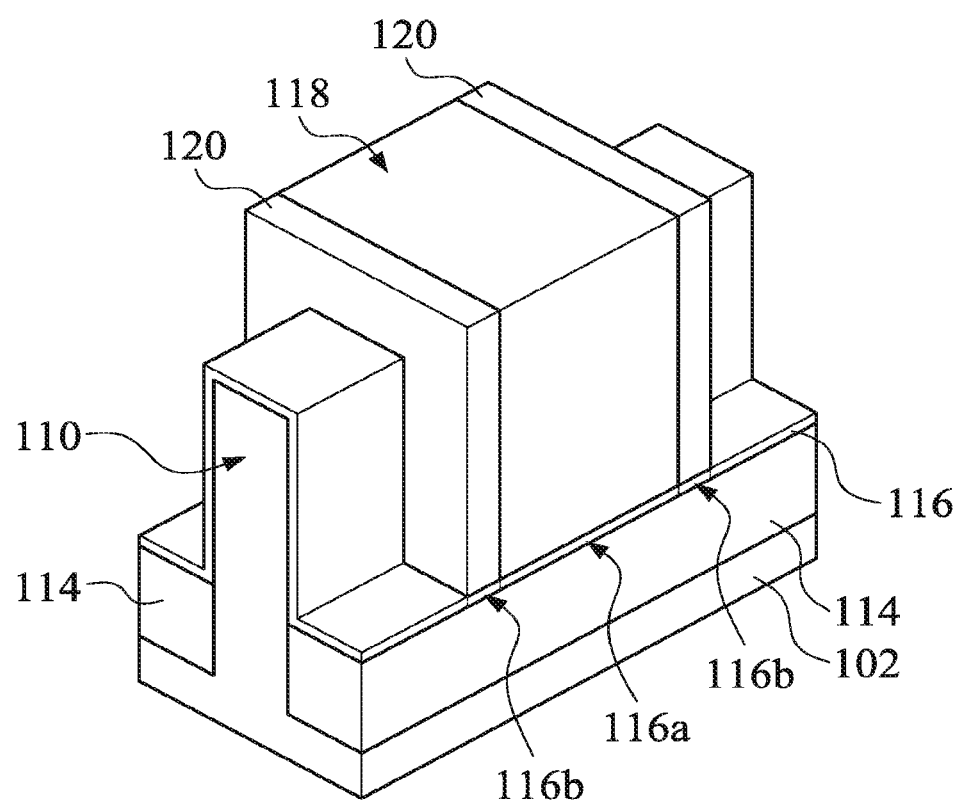

Afterwards, a dielectric layer 116 is formed to cover fin structure 110 and isolation structure 114, and a dummy gate structure 118 is formed over fin structure 110, as shown in FIG. 1E in accordance with some embodiments.

In some embodiments, dielectric layer 116 is made of silicon nitride, silicon oxide, silicon oxynitride, or other applicable dielectric materials. Dielectric layer 116 may be formed by chemical vapor deposition (CVD), physical vapor deposition, (PVD), atomic layer deposition (ALD), spin-on coating, or other applicable processes.

Dummy gate structure 118 is formed across fin structure 110 and extends over isolation structure 114. In some embodiments, dummy gate structure 118 is made of polysilicon.

After dummy gate structure 118 is formed, spacers 120 are formed on the sidewalk of dummy gate structure 118 in accordance with some embodiments. As shown in FIG. 1E, dummy gate structure 118 is formed on a first portion 116a of dielectric layer 116, and spacers are formed on second portions 116b of dielectric layer 116.

Since spacers 120 are formed on the sidewalls of dummy gate structure 118, each spacer 120 has a first height $H_1$ substantially equal to the height of dummy gate structure 118.

In some embodiments, spacers 120 are made of silicon nitride, silicon oxide, silicon oxynitride, silicon carbide, or other applicable dielectric materials. Spacers 120 may include a single layer or multiple layers.

Figure 1F:
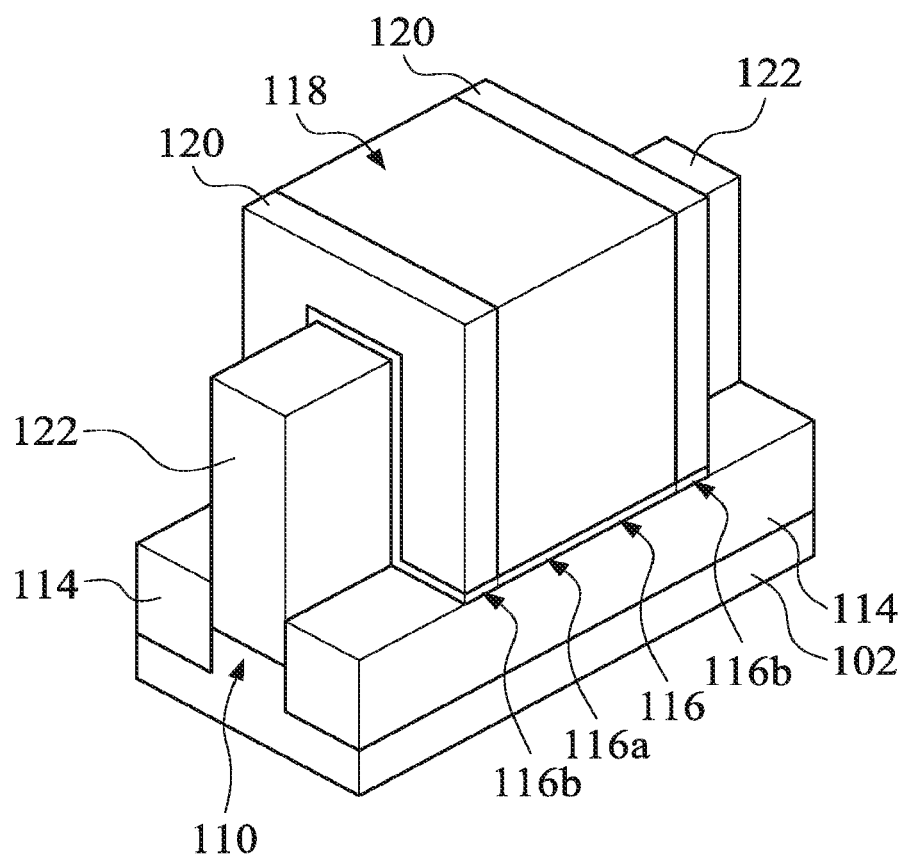

Next, source/drain structures 122 are formed in fin structure 110, as shown in FIG. 1F in accordance with some embodiments. More specifically, the portions of dielectric layer 116 not covered by dummy gate structure 118 and spacers 120 are removed. As shown in FIG. 1F, first portion 116a of dielectric layer 116 below dummy gate structure 118 and second portion 116b of dielectric layer 118 are not removed in this step. After the exposed dielectric layer 116 is removed, the portions of fin structure 110 adjacent to dummy gate structure 118 are recessed to form recesses at two sides of fin structure 110. Next, a strained material is grown in the recesses by an epitaxial (epi) process. In addition, the lattice constant of the strained material may be different from the lattice constant of substrate 102. In some embodiments, source/drain structures 122 include Ge, SiGe, InAs, InGaAs, InSb, GaAs, GaSb, InAlP, InP, or the like.

Figure 1G:
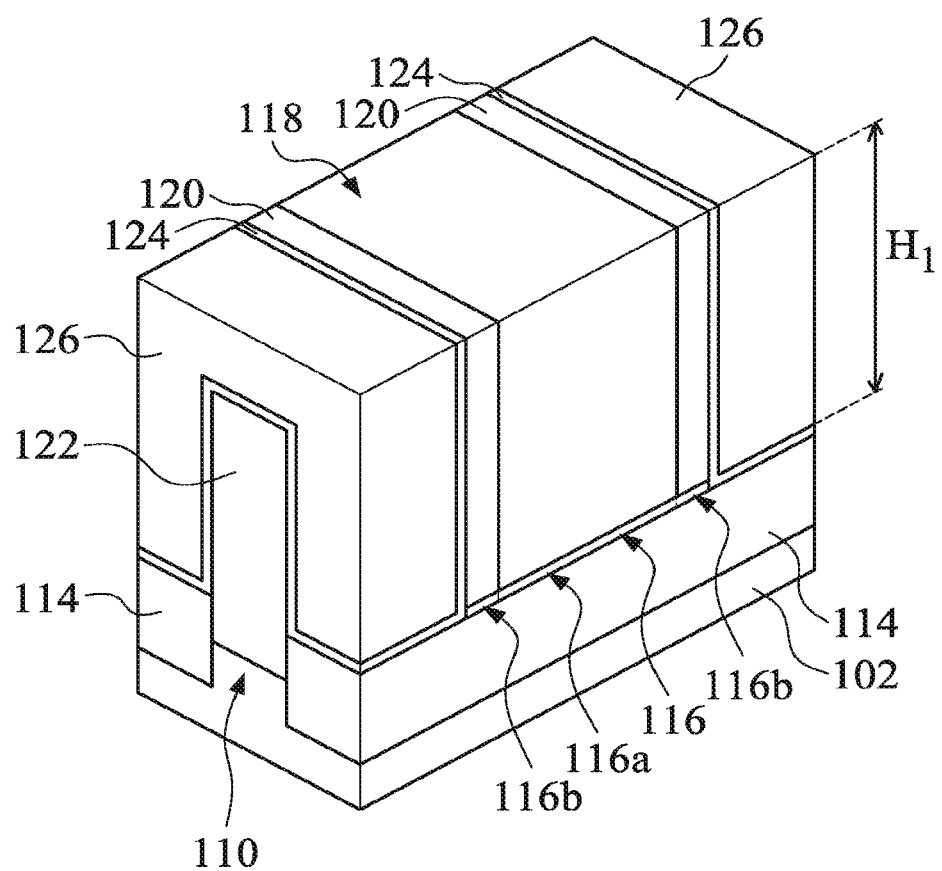

After source/drain structures 122 are formed, a contact etch stop layer (CESL) 124 is formed over substrate 102, and an inter-layer dielectric (ILD) layer 126 is formed on contact etch stop layer 124, as shown in FIG. 1G in accordance with some embodiments. In some embodiments, contact etch stop layer 124 is made of silicon nitride, silicon oxynitride, and/or other applicable materials. Contact etch stop layer 124 may be formed by plasma enhanced CVD, low pressure CVD, ALD, or other applicable processes.

Inter-layer dielectric layer 126 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 126 may be formed by chemical vapor deposition (CVD), physical vapor deposition, (PVD), atomic layer deposition (ALD), spin-on coating, or other applicable processes.

Next, a polishing process is performed on inter-layer dielectric layer 126 and contact etch stop layer 124 to expose the top surface of dummy gate structure 118 in accordance with some embodiments. In some embodiments, a chemical mechanical polishing (CMP) process is performed until the top surface of dummy gate structure 118 is exposed.

Figure 1H:
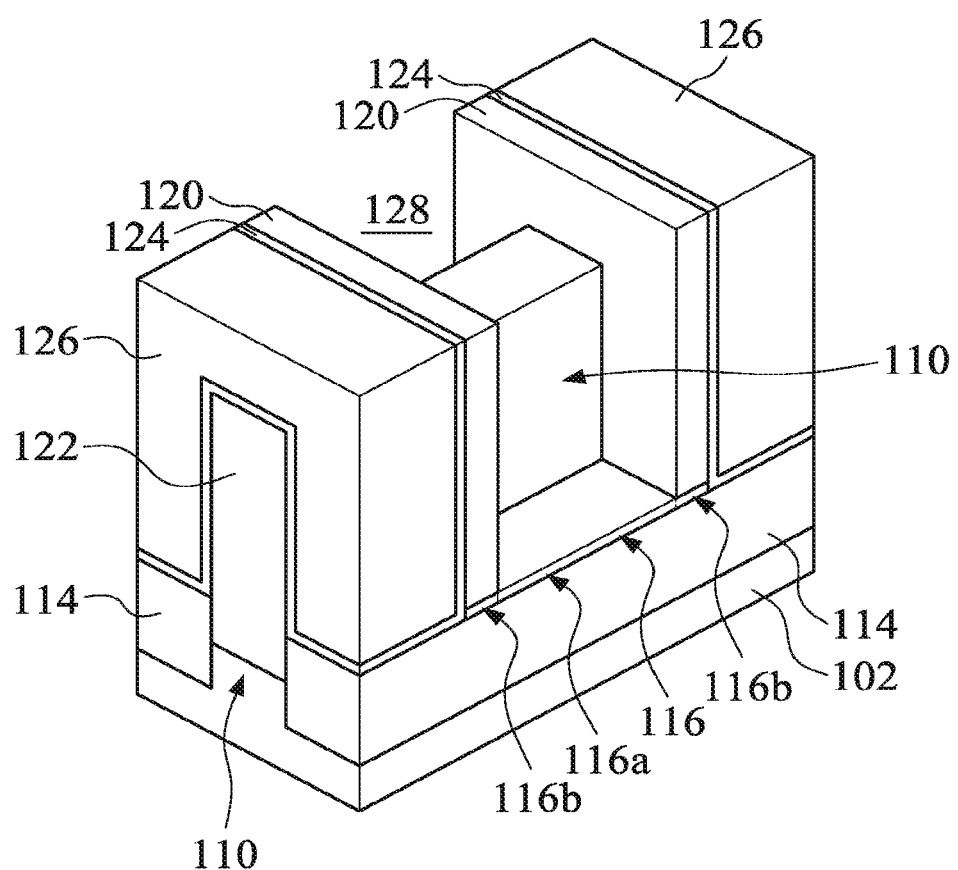

After the polishing process is performed, dummy gate structure 118 is removed, such that a trench 128 is formed, as shown in FIG. 1H in accordance with some embodiments. In some embodiments, dummy gate structure 118 is removed by performing a dry etching process. In some embodiments, dummy gate structure 118 is removed by performing a dry etching process and a wet etching process. As shown in FIG. 1H, the bottom surface of each spacer 120 is substantially level with the bottom surface of trench 128.

Figure 1I:
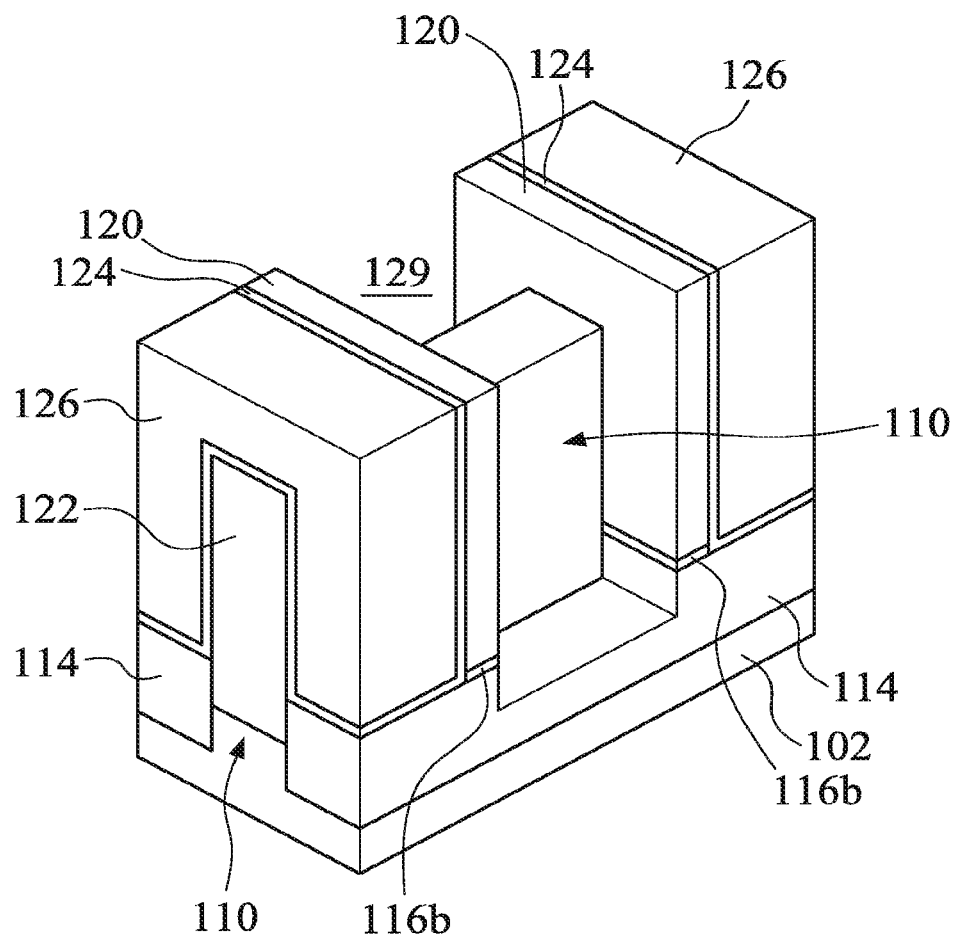

After dummy gate structure 118 is removed, first portion 116a of dielectric layer 116 exposed by trench 128 and an upper portion of isolation structure 114 below first portion 116a of dielectric layer 116 are removed, as shown in FIG. 1I in accordance with some embodiments. In some embodiments, first portion 116a of dielectric layer 116 is removed by a first etching process and the upper portion of isolation structure 114 is removed by a second etching process. In some embodiments, first portion 116a of dielectric layer 116 and the upper portion of isolation structure 114 are removed by the same etching process.

As shown in FIG. 1I, since the portion of the upper portion of isolation structure 114 is removed, trench 128 is further extended into isolation structure 114 to form an extended trench 129, such that the bottom surface of each spacer 120 is not level with (e.g. is higher than) the bottom surface of extended trench 129.

After the upper portion of isolation structure 114 is removed to form extended trench 129, a metal gate structure 130 is formed in extended trench 129, as shown in FIG. 1I in accordance with some embodiments. In some embodiments, metal gate structure 130 includes a gate dielectric layer 132, a work function metal layer 134, and a metal gate electrode layer 136.

In some embodiments, gate dielectric layer 132 is made of high k dielectric materials. Examples of the high k dielectric material may include, but are not limited to, hafnium oxide ($HfO_2$), hafnium silicon oxide (HfSio), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 134 is formed over gate dielectric layer 132 in accordance with some embodiments. Work function metal layer 134 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Metal gate electrode layer 136 is formed over work function metal layer 134 in accordance with some embodiments. In some embodiments, metal gate electrode layer 136 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. Gate dielectric layer 132, work function metal layer 134, and metal gate electrode layer 136 may be formed by any applicable process to any applicable thickness.

It should be noted that additional layers may be formed above and/or below gate dielectric layer 132, work function metal layer 134, and metal gate electrode layer 136, such as liner layers, interface layers, seed layers, adhesion layers, barrier layers, or the like. In addition, gate dielectric layer 132, work function metal layer 134, and metal gate electrode layer 136 may include more than one layer made of various materials.

Figure 1J:
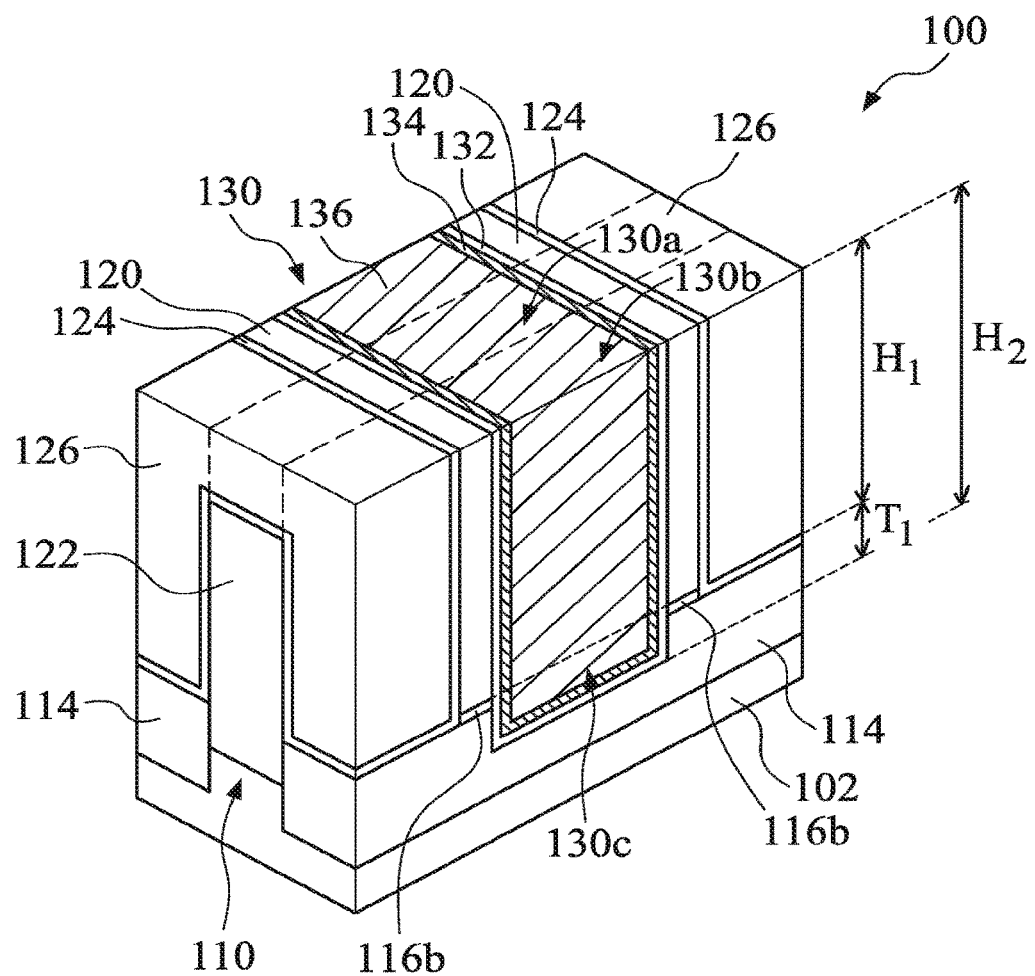

As shown in FIG. 1J, metal gate structure 130 is formed across fin structure 110 and extends over isolation structure 114. More specifically, metal gate structure 130 includes a first portion 130a formed over fin structure 110 and a second portion 130b formed over isolation structure 114, Since the upper portion of isolation structure 114 is removed so that extended trench 129 can be extended into isolation structure 114, second portion 130b of metal gate structure 130 formed over extended trench 129 is also extended into isolation structure 114. Accordingly, second portion 130a of metal gate structure 130 has a second height $H_2$ which is greater than the first height $H_1$ of spacer 120.

More specifically, second portion 130b includes an extending portion 130c extending into isolation structure 114. The formation of extending portion 130c can enlarge the effective area of metal gate structure 130 and/or may be used to adjust the electrical properties of semiconductor structure 100. As shown in FIG. 1J, extending portion 130c has a thickness $T_1$, which may also be defined as the difference between the first height $H_1$ and the second height $H_2$. In some embodiments, the thickness $T_1$ of extending portion 130c is in a range from about 10 Å to about 2000 Å. Although the formation of extending portion 130c can enlarge the effective area of the structure, if extending portion 130c is too thick, the risk of leakage may also increase.

The thickness $T_1$ of extending portion 130c may be adjusted by changing the etching time for etching isolation structure 114. In some embodiments, the thickness $T_1$ of extending portion 130c is in a range from about 30 Å to about 300 Å. In some embodiments, the thickness $T_1$ of extending portion 130c is in a range from about 30 Å to about 800 Å. In some embodiments, the thickness $T_1$ of extending portion 130c is in a range from about 800 Å to about 1200 Å. In some embodiments, the thickness $T_1$ of extending portion 130c is in a range from about 1200 Å to about 1500 Å. In some embodiments, the thickness $T_1$ of extending portion 130c is in a range from about 1500 Å to about 2000 Å. Extending portion 130c with a different thickness may have different electrical properties, and therefore the thickness $T_1$ of extending portion 130c may be adjusted according to its applications. In some embodiments, the bottom surface of the gate structure 130 is substantially level with or lower than the bottom surface of the fin structure 110. Alternatively, the bottom surface of the gate structure 130 is higher than the bottom surface of the fin structure 110.

Figure 2A:
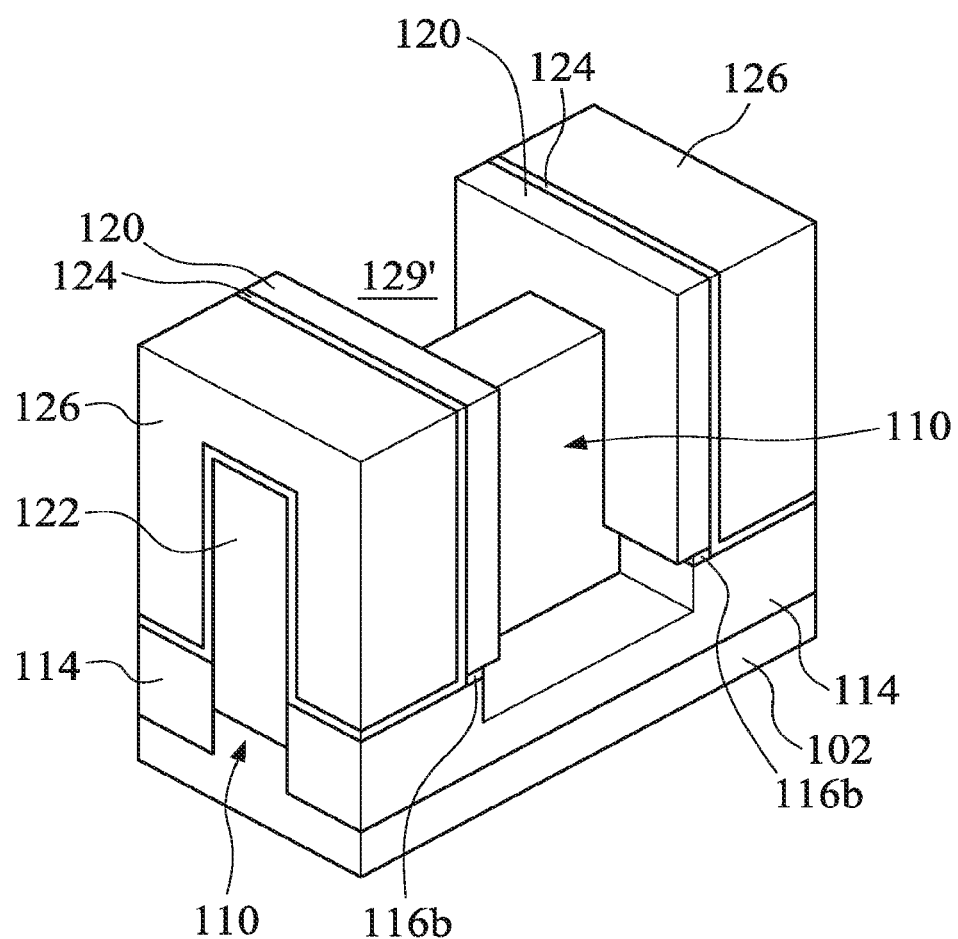
FIGS. 2A to 2B are cross-sectional representations of a semiconductor structure in accordance with some embodiments.
Figure 2B:
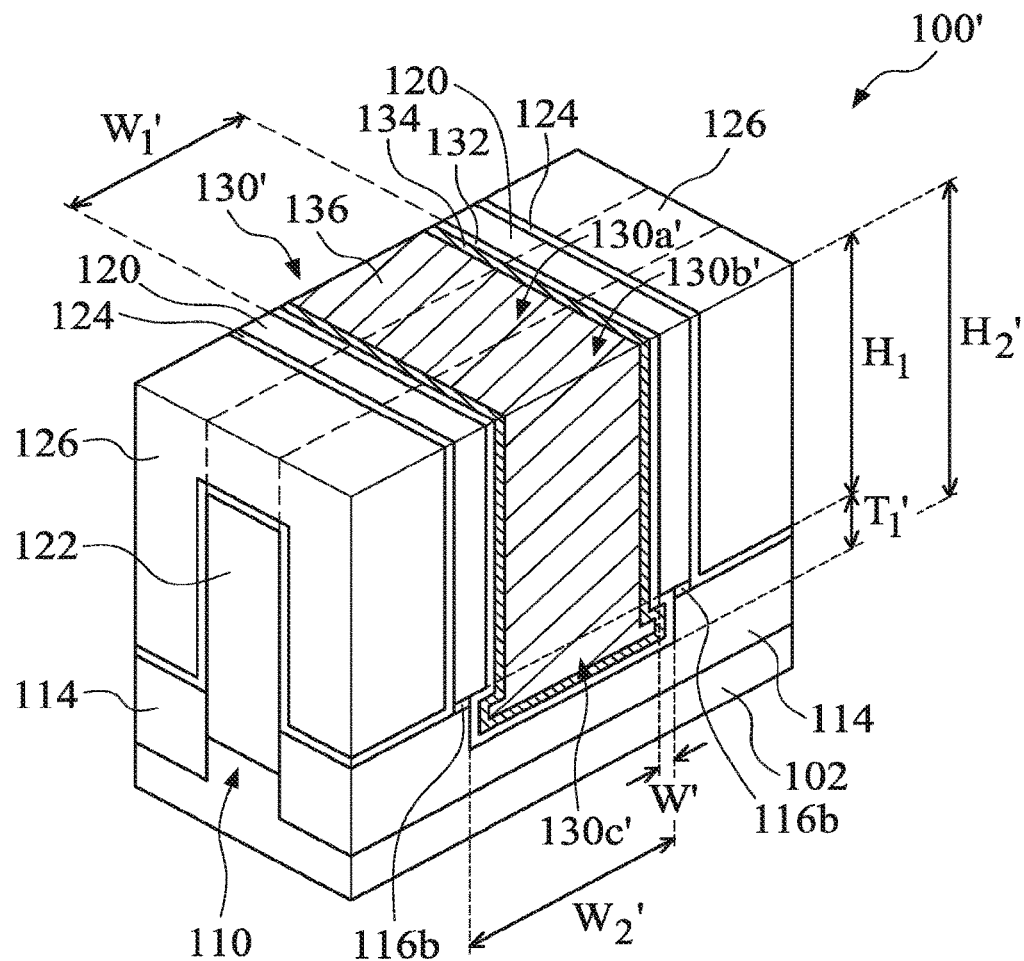

FIGS. 2A to 2B are cross-sectional representations of various stages of forming a semiconductor structure 100' in accordance with some embodiments, Methods and materials used to form semiconductor structure 100' are similar to, or the same as, those used to form semiconductor structure 100 described in FIGS. 1A to 1J, except the extending portion of the metal gate structure further extends under the spacers.

More specifically, the processes shown in FIGS. 1A to 1H are performed, and the details are not repeated herein, After dummy gate structure 118 is removed, trench 128 is further extended into isolation structure 114 to form an extended trench 129' by etching dielectric layer 116 and isolation structure 114, as shown in FIG. 2A in accordance with some embodiments.

Similar to that shown in FIG. 1I, first portion 116a of dielectric layer 116 exposed by trench 128 and an upper portion of isolation structure 114 positioned below first portion 116a of dielectric layer 116 are removed. In addition, some portions of second portion 116b of dielectric layer 116 and isolation structure 114 positioned below spacers 120 are also removed.

As shown in FIG. 2A, after the etching process, extended trench 129' further extends below spacers 120, such that metal gate structure 130' formed in extended trench 129' also extends below spacers 120, as shown in FIG. 2B in accordance with some embodiments. In some embodiments, metal gate structure 130' is similar to metal gate 130 shown in FIG. 1J and includes gate dielectric layer 132, work function metal layer 134, and metal gate electrode layer 136.

As shown in FIG. 2B, metal gate structure 130' is formed across fin structure 110 and extends over isolation structure 114. More specifically, metal gate structure 130' includes a first portion 130a' formed over fin structure 110 and a second portion 130b' formed over isolation structure 114. In addition, second portion 130b' further includes an extending portion 130c' extending into isolation structure 114 and extending below spacers 120.

More specifically, extending portion 130c' extends to a position below spacer 120, such that a portion of extending portion 130c' overlaps with spacer 120. In some embodiments, the portion of extending portion 130c' overlapped with spacer 120 has a width W' in a range from about 5 Å to about 100 Å. The formation of extending portion 130c' extending to a position below spacer 120 enables to enlarge the effective area of the structure. However, if the width W' is too great, the risk of bridging may also increase.

As shown in FIG. 2B, the width of extending portion 130c' is greater than that of first portion 130a' of metal gate structure 130' formed over fin structure 110. In some embodiments, first portion 130a' of metal gate structure 130' has a first width $W_1'$, and extending portion 130c' of metal gate structure 130' has a second width $W_2'$, which is greater than the first width $W_1'$, in some embodiments, the difference between the first width $W_1'$ and the second width $W_2'$ is in a range from about 5 Å to about 200 Å. The electrical performance may be adjusted by changing the second width $W_2'$ of extending portion 130c'. However, if the second width $W_2'$ of extending portion 130c' is too great, the risk of leakage may increase.

Similar to those shown in FIG. 1J, second portion 130a' of metal gate structure 130 has a second height $H_2'$, which is greater than the first height $H_1$ of spacer 120. In addition, extending portion 130c' has a thickness $T_1'$, which may also be defined as the difference between the first height $H_1'$ and the second height $H_2'$. In some embodiments, the thickness $T_1'$ of extending portion 130c' is in a range similar to, or the same as, the thickness $T_1$ of extending portion 130c described previously.

Figure 3A:
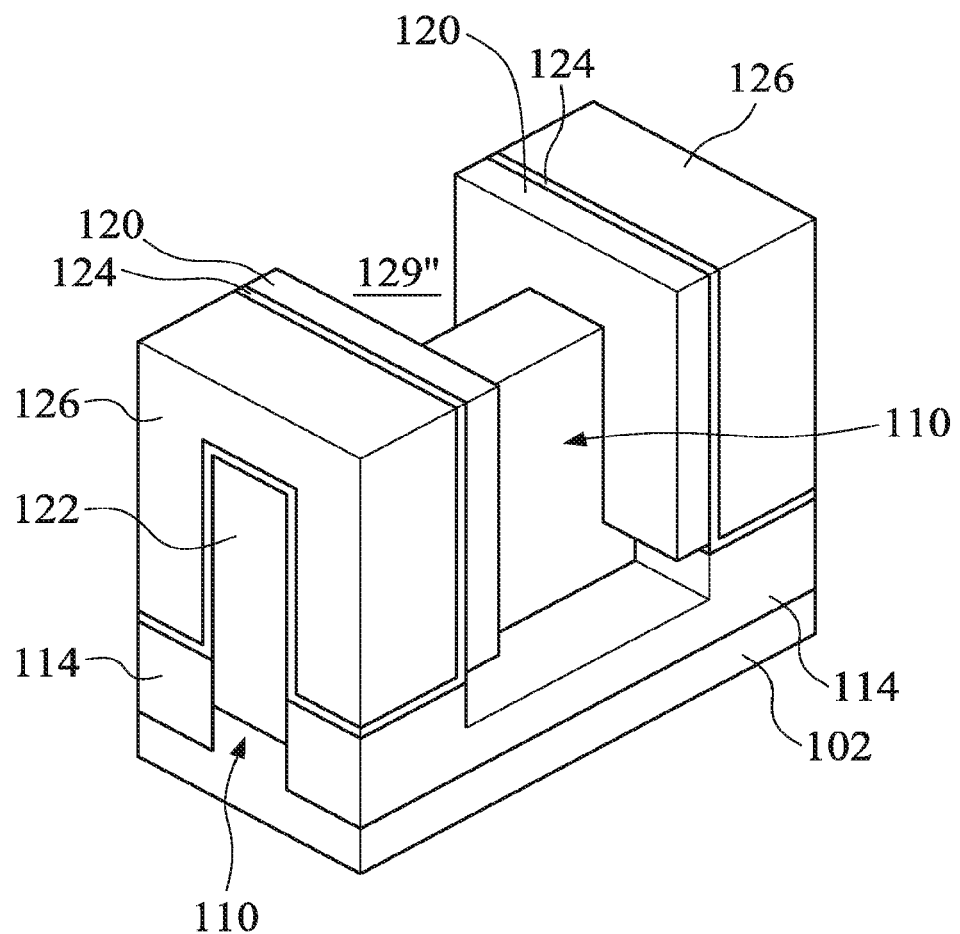
FIGS. 3A to 3B are cross-sectional representations of a semiconductor structure in accordance with some embodiments.
Figure 3B:
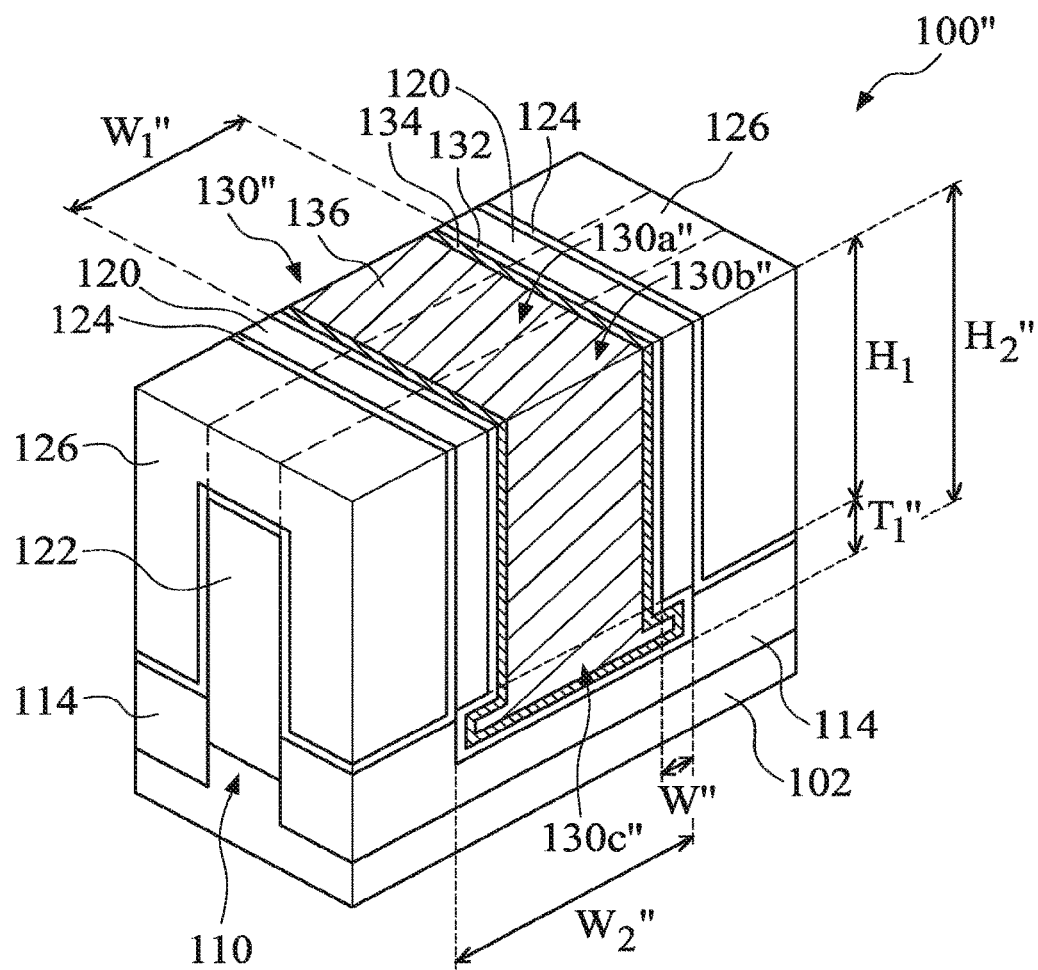

FIGS. 3A to 3B are cross-sectional representations of various stages of forming a semiconductor structure 100" in accordance with some embodiments. Methods and materials used to form semiconductor structure 100" are similar to, or the same as, those used to form semiconductor structures 100 and 100' described previously, except the second portion of dielectric layer formed below the spacers are completely removed and the extending portion extends below the spacers.

More specifically, the processes shown in FIGS. 1A to 1H are performed, and the details are not repeated herein, After dummy gate structure 118 is removed, trench 128 is further extended into isolation structure 114 to form an extended trench 129" by etching dielectric layer 116 and isolation structure 114, as shown in FIG. 3A in accordance with some embodiments.

Similar to that shown in FIG. 1I, first portion 116a of dielectric layer 116 exposed by trench 128 and an upper portion of isolation structure 114 below first portion 116a of dielectric layer 116 are removed, in addition, second portion 116b of dielectric layer 116 and portions of isolation structure 114 positioned below spacers 120 are also removed. That is, dielectric layer 116 shown in FIG. 1F is completely removed in the embodiments.

As shown in FIG. 3A, after the etching process, extended trench 129" extends further below spacers 120, and a metal gate structure 130" is formed in extended trench 129", as shown in FIG. 3B in accordance with some embodiments. In some embodiments, metal gate structure 130" is similar to metal gate structure 130 shown in FIG. 1J and includes gate dielectric layer 132, work function metal layer 134, and metal gate electrode layer 136.

As shown in FIG. 3B, metal gate structure 130" is formed across fin structure 110 and extends over isolation structure 114. More specifically, metal gate structure 130" includes a first portion 130a" formed over fin structure 110 and a second portion 130b" formed over isolation structure 114. In addition, second portion 130b" further includes an extending portion 130c" extending into isolation structure 114 and extending below spacers 120.

As shown in FIG. 3B, the second portion of dielectric layer 116 formed below spacers 120 are completely removed, and the portion of extending portion 130c' which is overlapped with spacer 120 has a width W" substantially equal to the width of spacer 120. In some embodiments, the width W" of the portion of extending portion 130c' overlapped with spacer 120 is in a range from about 5 Å to about 100 Å.

In some embodiments, first portion 130a" of metal gate structure 130" has a first width $W_1"$, and extending portion 130c" of metal gate structure 130" has a second width $W_2"$, which is greater than the first width $W_1"$. In some embodiments, the difference between first width $W_1"$ and second width $W_2"$ is in a range from about 5 Å to about 200 Å.

Similar to those shown in FIG. 1J, second portion 130a" of metal gate structure 130 has a second height $H_2"$, which is greater than the first height $H_1$ of spacer 120. In addition, extending portion 130c" has a thickness $T_1"$, which may also be defined as the difference between first height $H_1$ and second height $H_2"$. In some embodiments, thickness $T_1"$ of extending portion 130c" is in a range similar to, or the same as, thickness $T_1$ of extending portion 130c described previously.

In a planar transistor, the electrical properties can be controlled by implantation. However, for a finFET transistor, it becomes difficult to control the electrical properties by implantation. Accordingly, in some embodiments of the disclosure, a metal gate structure, such as metal gate structures 130, 130', and 130", is used to adjust the electrical properties of the structure.

More specifically, the metal gate structure is formed in a "gate-last" process. That is, dummy gate structure 118 is formed across fin structure 110 and extends over isolation structure 114, and spacers 120 are formed on the sidewalls of dummy gate structure 118. Afterwards, dummy gate structure 118 and a portion of isolation structure 114 are removed to form an extended trench, such as extended trench 129, 129', and 129". Accordingly, the metal gate structure formed in the extended trench can have an extending portion, such as extending portion 130c, 130c', and 130c", extending into isolation structure 114.

The extending portion of the metal gate structure provides a larger effect area for the metal gate structure and therefore the performance of the semiconductor structure, such as a FinFET structure, can be improved. In addition, the extending portion may also be used to adjust the electrical properties of the semiconductor structure. In some embodiments, the extending portion, such as extending portion 130' and 130", further extends to a position below spacers 120 to have an even larger effective area. That is, the size of the extending portion may be adjusted according to its application.

It should be noted that, although a relatively higher metal gate structure may also be formed by forming a higher dummy gate structure, the processes of forming the higher dummy gate structure may be quite challenging. For example, a fin with a high aspect ratio should be formed and a great amount of the insulating layer should be etched to form a shallow trench isolation structure. These processes may result in poor uniformity and the yield of manufacturing the structure may be decreased.

On the other hand, by using the processes described in FIGS. 1A to 3B, the metal gate structure having a relatively larger height can be formed without using the processes described above. Therefore, the uniformity of manufacturing the structure can be improved. In addition, the methods described above can be implemented in present manufacturing processes without using additional complicated processes, such as masking or alignment. Therefore, metal gate structures 130, 130', and 130" can be formed without changing or affecting other manufacturing processes. Accordingly, the performance of semiconductor structures 100, 100', and 100" can be improved, and the yield can be increased.

Embodiments of a semiconductor structure and methods for forming the semiconductor structures are provided. The semiconductor structure includes a fin structure and an isolation structure formed around the fin structure. A gate structure is formed across the fin structure and extends over the isolation structure. In addition, the gate structure includes an extending portion extending into the isolation structure, such that an effective area of the structure is increased. Accordingly, the electrical properties of semiconductor structure can be adjusted by the extending portion of the gate structure, and the performance and uniformity of the semiconductor structure can be improved.

In some embodiments, a semiconductor structure is provided. The semiconductor structure includes a substrate and a fin structure formed over the substrate. The semiconductor structure further includes an isolation structure formed around the fin structure and a gate structure formed across the fin structure. In addition, the gate structure includes a first portion formed over the fin structure and a second portion formed over the isolation structure, and the second portion of the gate structure includes an extending portion extending into the isolation structure.

In some embodiments, a semiconductor structure is provided. The semiconductor structure includes a substrate and a fin structure formed over the substrate. The semiconductor structure further includes an isolation structure formed around the fin structure and a gate structure formed across the fin structure and extending over the isolation structure. The semiconductor structure further includes a spacer formed on a sidewall of the gate structure. In addition, a portion of the spacer formed on the sidewall of the gate structure over the isolation structure has a first height, and a portion of the gate structure formed over the isolation structure has a second height which is greater than the first height.

In some embodiments, a method for manufacturing a semiconductor structure is provided. The method for manufacturing a semiconductor structure includes forming a fin structure over a substrate and forming an isolation structure around the fin structure over the substrate. The method for manufacturing a semiconductor structure further includes forming a dummy gate structure across the fin structure. The method for manufacturing a semiconductor structure further includes forming spacers on sidewalls of the dummy gate structure. The method for manufacturing a semiconductor structure further includes removing the dummy gate structure to form a trench between the spacers. The method for manufacturing a semiconductor structure further includes removing a portion of the isolation structure to form an extended trench extending into the isolation structure and forming a gate structure in the extended trench, wherein a portion of the gate structure extends into the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a fin structure protruding from a substrate;
    forming an isolation structure around the fin structure over the substrate;
    forming a dummy gate structure across the fin structure, the dummy gate structure including a dummy gate dielectric layer and a dummy gate electrode layer, and sidewall spacers such that a part of the dummy gate dielectric layer is disposed between at least one of the sidewall spacers and the isolation structure;
    removing the dummy gate dielectric layer except for the part of the dummy gate dielectric layer and the dummy gate electrode layer to form a trench between the sidewall spacers;
    removing a portion of the isolation structure to form an extended trench extending into the isolation structure; and
    forming a gate structure in the extended trench, wherein:
    a portion of the extended trench further extends to a position below the sidewall spacers, and
    after the gate structure is formed, the part of the dummy gate dielectric layer remains, and the gate structure is in contact with the part of the dummy gate dielectric layer and the sidewall spacers.

2. The method of claim 1, wherein a portion of the sidewall spacers is positioned over the isolation structure and has a first height and a portion of the gate structure is positioned over the isolation structure and has a second height which is greater than the first height.

3. The method of claim 1, wherein:
    the dummy gate electrode is formed on a first portion of the dummy gate dielectric layer and the sidewall spacers are formed on a second portion of the dummy gate dielectric layer,
    the first portion of the dummy gate dielectric layer is removed, and
    the second portion of the dummy gate dielectric layer remains and is in direct contact with the gate structure.

4. The method of claim 3, wherein, in the removing a portion of the isolation structure, a part of the second portion of the dummy gate dielectric layer is removed.

5. The method of claim 1, wherein the forming the gate structure in the trench further comprises:
    depositing a gate dielectric layer over a bottom surface and sidewalls of the trench;
    depositing a work function metal layer over the gate dielectric layer; and
    depositing a metal gate electrode layer over the work function metal layer.

6. The method of claim 5, wherein the gate dielectric layer is in contact with the part of the dummy gate dielectric layer and the sidewall spacers.

7. The method of claim 5, wherein a part of the work function metal layer is located below the sidewall spacers.

8. The method of claim 7, wherein a part of the metal gate electrode layer is located below the sidewall spacers.

9. The method of claim 1, wherein after the trench is formed, a bottom of the trench is in contact with the fin structure.

10. The method of claim 1, wherein the gate structure comprises a first portion formed over the fin structure and a second portion formed over the isolation structure, and the second portion of the gate structure comprises an extending portion extending into the isolation structure.

11. The method of claim 10, wherein the extending portion of the second portion of the gate structure has a thickness in a range from 10 Å to 2000 Å.

12. The method of claim 10, wherein the sidewall spacers do not extend into the isolation structure.

13. The method of claim 12, wherein a bottom surface of the spacer is not level with a bottom surface of the second portion of the gate structure over the isolation structure.

14. The method of claim 12, wherein the spacer has a first height, and the second portion of the gate structure has a second height which is greater than the first height.

15. The method of claim 10, wherein the first portion of the gate structure has a first width, and the extending portion of the second portion of the gate structure has a second width which is greater than the first width.

16. The method of claim 15, wherein a difference between the first width and the second width is in a range from 5 Å to 200 Å.

17. A method for manufacturing a semiconductor device, comprising:
   forming a fin structure protruding from a substrate;
   forming an isolation insulating layer around the fin structure over the substrate;
   forming a dummy gate structure across the fin structure, the dummy gate structure including a dummy gate dielectric layer and a dummy gate electrode layer, and sidewall spacers such that a part of the dummy gate dielectric layer is disposed between at least one of the sidewall spacers and the isolation structure;
   forming an interlayer dielectric layer disposed at both vertical sides of the sidewall insulating layers;
   removing the dummy gate electrode layer and the dummy gate dielectric layer except for the part of the dummy gate dielectric layer so that a space is created;
   etching the a surface of the isolation insulating layer in the space so as to form a recess; and
   forming a gate structure in the space and the recess,
   wherein, after the gate structure is formed, the part of the dummy gate dielectric layer remains, and the gate structure is in direct contact with part of the dummy gate dielectric layer and the sidewall spacers.

18. The method of claim 17, wherein a depth of the recess from a level of a bottom surface of the sidewall insulating layers is in a range of 1 nm to 200 nm.

19. The method of claim 17, wherein a portion of the recess further extends to a position below the sidewall spacers.

20. A method for manufacturing a fin field effect transistor, comprising:
   forming a fin structure over a substrate;
   forming an isolation structure around the fin structure over the substrate;
   forming a first dielectric layer;
   after the first dielectric layer is formed, forming a dummy gate structure across the fin structure;
   forming sidewall spacers on sidewalls of the dummy gate structure such that a part of the first dielectric layer is disposed between at least one of the sidewall spacers and the isolation structure;
   forming a second dielectric layer on the sidewall spacers and on the isolation structure;
   forming an interlayer dielectric layer on the second dielectric layer;
   removing the dummy gate structure and the first dielectric layer except for the part of the first dielectric layer to form a trench between the sidewall spacers;
   removing a portion of the isolation structure to form an extended trench extending into the isolation structure; and
   forming a gate structure in the extended trench, wherein:
   a portion of the extended trench further extends to a position below the sidewall spacers,
   after the gate structure is formed, the part of the first dielectric layer remains,
   the sidewall spacers and the first dielectric layer are made of different materials, and
   the sidewall spacers are in direct contact with the gate structure.

* * * * *